(12) United States Patent
Aoyama

(10) Patent No.: US 10,453,715 B2
(45) Date of Patent: Oct. 22, 2019

(54) LIGHT-IRRADIATION TYPE THERMAL PROCESSING METHOD AND THERMAL PROCESSING APPARATUS

(71) Applicant: SCREEN Holdings Co., Ltd., Kyoto (JP)

(72) Inventor: Takayuki Aoyama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 389 days.

(21) Appl. No.: 15/205,386

(22) Filed: Jul. 8, 2016

(65) Prior Publication Data
US 2017/0053818 A1 Feb. 23, 2017

(30) Foreign Application Priority Data
Aug. 17, 2015 (JP) ................. 2015-160420

(51) Int. Cl.
*F26B 19/00* (2006.01)
*H01L 21/67* (2006.01)
(Continued)

(52) U.S. Cl.
CPC ...... *H01L 21/67115* (2013.01); *H01L 21/324* (2013.01); *H01L 21/67248* (2013.01); *H01L 22/10* (2013.01)

(58) Field of Classification Search
None
See application file for complete search history.

(56) References Cited

U.S. PATENT DOCUMENTS 5,501,637 A * 3/1996 Duncan ................ G01J 5/0003
250/225
6,056,434 A * 5/2000 Champetier .......... G01J 5/0003
219/411
(Continued)

FOREIGN PATENT DOCUMENTS

CN 102487101 A 6/2012
JP 2006-135126 A 5/2006
(Continued)

OTHER PUBLICATIONS

Office Action dated Feb. 23, 2018 in counterpart Taiwanese Patent Application No. 105121619 with Japanese translation and English translation based on the Japanese translation. Portions relevant to prior-art based rejections are translated.
(Continued)

*Primary Examiner* — Thor S Campbell
(74) *Attorney, Agent, or Firm* — Ostrolenk Faber LLP

(57) ABSTRACT

From a stage of preheating by a halogen lamp to irradiation with a flash by a flash lamp, a radiation thermometer is used for measuring the temperature of a back surface of a semiconductor wafer. A increased temperature ΔT is determined by which the back surface of the semiconductor wafer is increased in temperature from the preheating temperature by irradiation with a flash. The specific heat of the semiconductor wafer has a known value. Further, the increased temperature ΔT is proportionate to the magnitude of energy applied to a front surface of the semiconductor wafer by irradiation with a flash. Thus, a front surface attained temperature of the semiconductor wafer can be determined using the increased temperature ΔT of the back surface of the semiconductor wafer during irradiation with a flash.

8 Claims, 10 Drawing Sheets

(51) Int. Cl.
*H01L 21/324* (2006.01)
*H01L 21/66* (2006.01)

(56) References Cited

U.S. PATENT DOCUMENTS

| | | | |
|---|---|---|---|
| 9,023,740 B2 | 5/2015 | Kato | |
| 9,607,870 B2* | 3/2017 | Kiyama | H01L 21/67115 |
| 2005/0063448 A1* | 3/2005 | Kusuda | H01L 21/67115 |
| | | | 374/1 |
| 2006/0051077 A1* | 3/2006 | Kubo | H01L 21/67115 |
| | | | 392/416 |
| 2009/0285568 A1* | 11/2009 | Kiyama | H01L 21/67115 |
| | | | 392/418 |
| 2012/0076476 A1* | 3/2012 | Kusuda | F27B 17/0025 |
| | | | 392/416 |
| 2012/0076477 A1* | 3/2012 | Kuroiwa | F27B 17/0025 |
| | | | 392/416 |
| 2012/0288261 A1* | 11/2012 | Hashimoto | F27B 17/0025 |
| | | | 392/416 |
| 2012/0288970 A1* | 11/2012 | Hashimoto | H01L 21/67115 |
| | | | 438/16 |
| 2013/0078786 A1 | 3/2013 | Fuse et al. | |
| 2013/0337661 A1 | 12/2013 | Kato | |
| 2014/0161429 A1 | 6/2014 | Yokouchi et al. | |
| 2015/0221533 A1 | 8/2015 | Kato | |

FOREIGN PATENT DOCUMENTS

| | | |
|---|---|---|
| JP | 2012-238779 | 12/2012 |
| TW | 201320191 A | 5/2013 |
| TW | 201405666 A | 2/2014 |
| TW | 201433643 A | 9/2014 |

OTHER PUBLICATIONS

Taiwanese Office Action dated May 4, 2017 with English translation of the Taiwanese Office Action based on the Japanese translation. Portions relevant to prior-art based rejections are translated.
Office Action (Decision of Refusal) dated Jul. 13, 2018 in counterpart Taiwanese Patent Application No. 105121619 with Japanese translation and English translation based on the Japanese translation. Portions relevant to prior-art based rejections are translated.
Office Action dated Aug. 28, 2018 in corresponding Chinese Patent Application No. 201610656585.1 translation and English translation based on the Japanese translation.
Second Office Action and Search Report dated Apr. 15, 2019 in counterpart Chinese Patent Application No. 201610656585.1 with Japanese translation and English translation based on the Japanese translation. Portions relevant to prior-art based rejections are translated.
Office Action (Notification of Reason(s) for Refusal) dated Mar. 5, 2019 in counterpart Japanese Patent Application No. 2015-160420 with partial English translation. Portions relevant to prior-art based rejections are translated.
Office Action and Search Report dated Jul. 11, 2019 in counterpart Taiwanese Patent Application No. 105121619 with Japanese translation and English translation based on the Japanese translation. Portions relevant to prior-art based rejections are translated.

* cited by examiner

F I G. 2
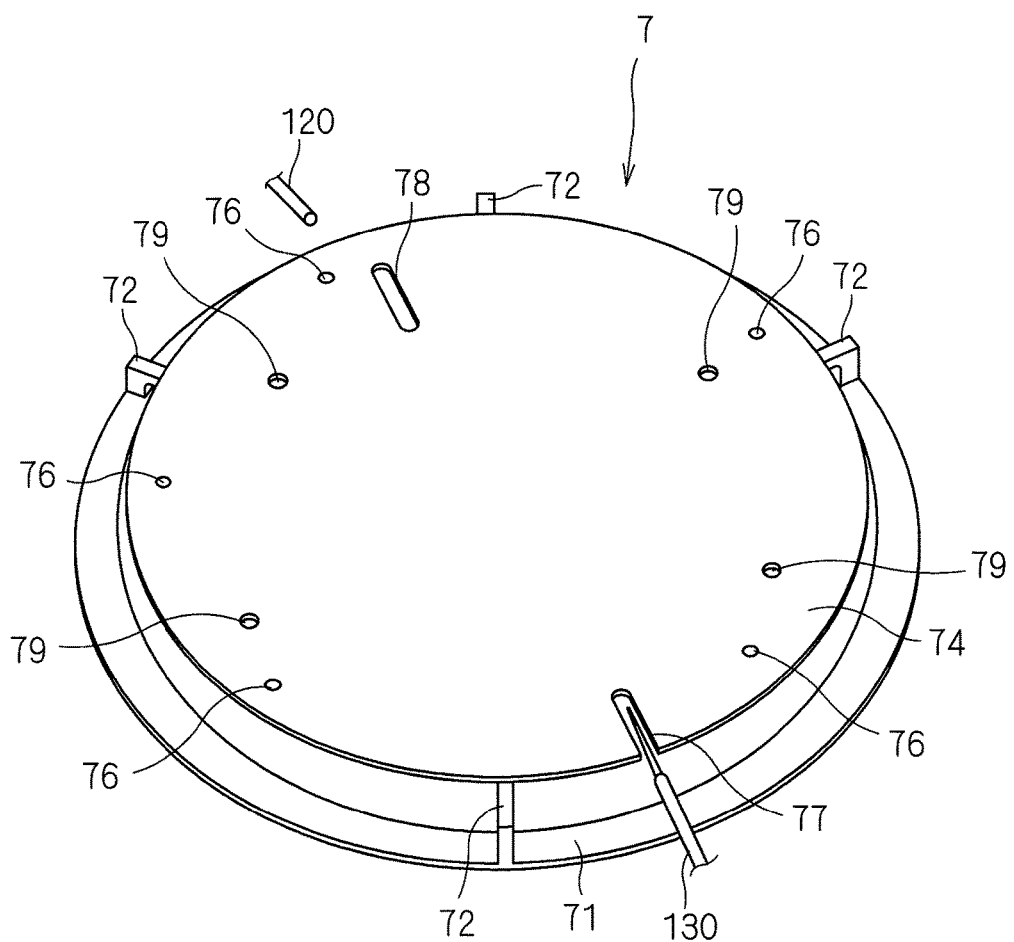

F I G. 3
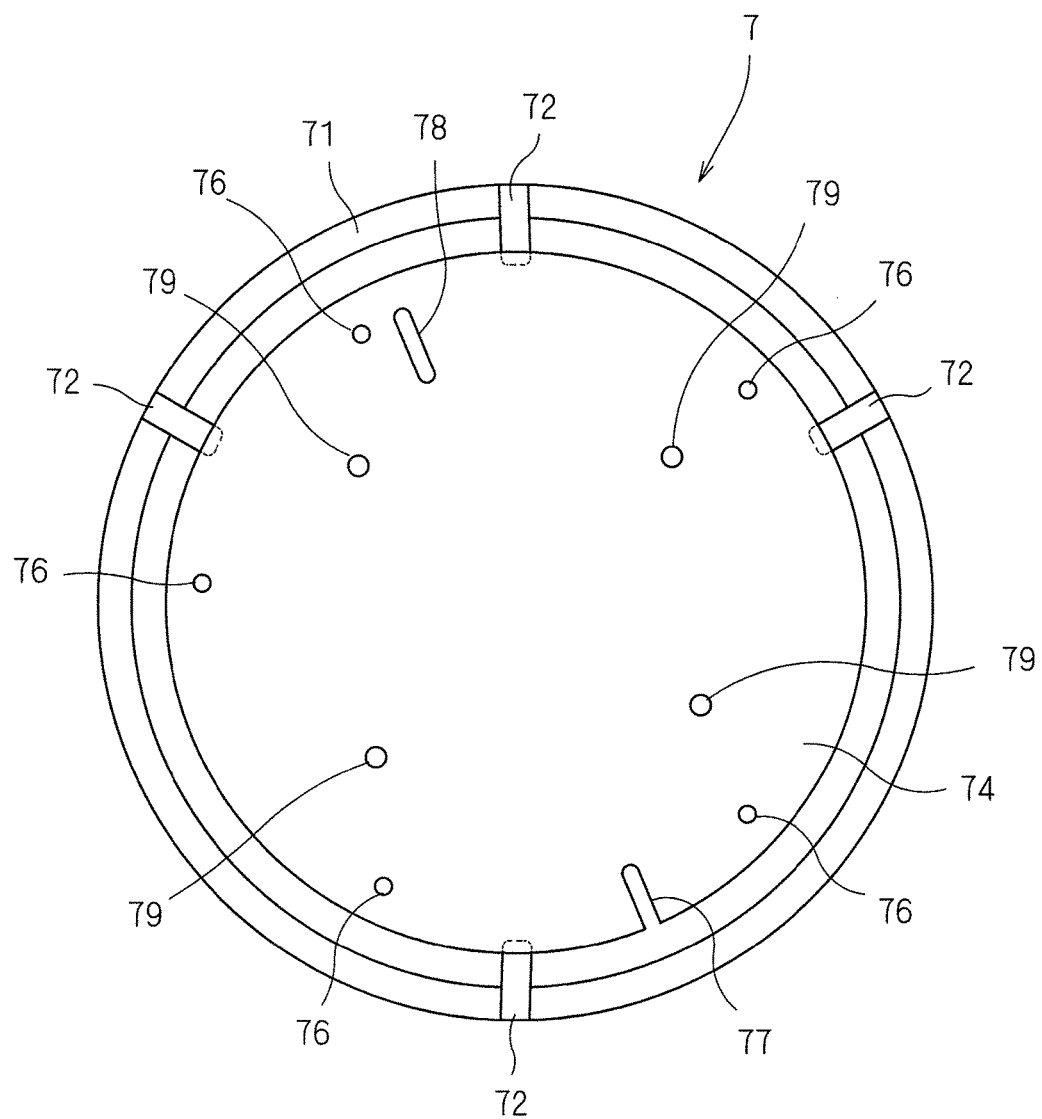

F I G . 6
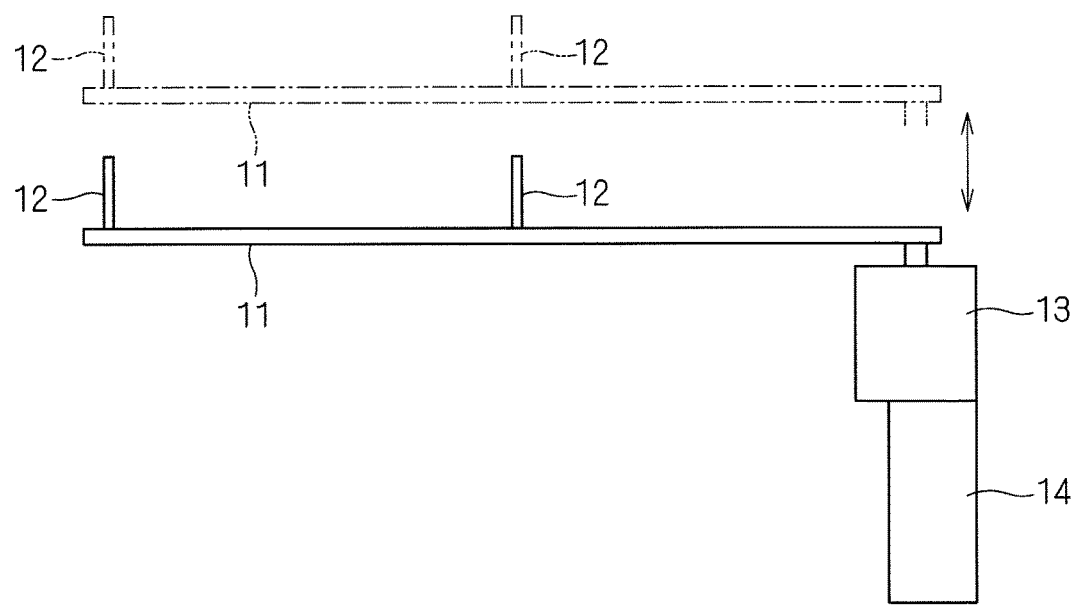

LIGHT-IRRADIATION TYPE THERMAL PROCESSING METHOD AND THERMAL PROCESSING APPARATUS

BACKGROUND OF THE INVENTION

Field of the Invention

The present invention relates to a thermal processing method and a thermal processing apparatus for heating a precision electronic substrate (hereinafter simply called a "substrate") in the form of a thin plate such as a semiconductor wafer by irradiating the substrate with a flash.

Description of the Background Art

Impurity introduction performed to form a pn junction in a semiconductor wafer is an essential step in manufacturing process of a semiconductor device. At present, impurities are introduced generally by ion implantation process and subsequent annealing process. The ion implantation process is a technique of implanting impurities physically by ionizing an impurity element such as boron (B), arsenic (As), or phosphorous (P), and making the impurity ions collide with the semiconductor wafer at a highly accelerated voltage. The implanted impurities are activated by the annealing process. If the annealing takes about several seconds or more, the implanted impurities are diffused deeply by heat and a resultant junction reaches a depth greater than is necessary. This might become an obstacle to favorable formation of a device.

Flash lamp annealing (FLA) has attracted attention in recent years as an annealing technique of heating a semiconductor wafer in an extremely short period of time. The flash lamp annealing is a thermal processing technique of increasing the temperature only of a front surface with implanted impurities of a semiconductor wafer in an extremely short period of time (several milliseconds or less) by irradiating the front surface of the semiconductor wafer with a flash using a xenon flash lamp (in the below, a lamp simply called a "flash lamp" means a xenon flash lamp).

The spectral distribution of light emitted from a xenon flash lamp ranges from an ultraviolet region to a near-infrared region, has a shorter wavelength than light from a conventional halogen lamp, and substantially agrees with a base absorption band of a silicon semiconductor wafer. Thus, irradiating the semiconductor wafer with a flash from the xenon flash lamp does not produce much transmitted light, so that the temperature of the semiconductor wafer can be increased rapidly. Additionally, it has become known that irradiation with a flash in an extremely short period of time of several milliseconds or less can increase the temperature only of a front surface and its vicinity of the semiconductor wafer selectively. As a result, increasing a temperature in an extremely short period of time by the xenon flash lamp can realize only activation of impurities without causing deep diffusion of the impurities.

During thermal process not limited to flash heating, what is important is to control the temperature of a semiconductor wafer properly. For such control, the temperature of the semiconductor wafer being processed thermally should be measured accurately. During thermal process on the semiconductor wafer, a temperature is typically measured using a non-contact radiation thermometer. For accurate temperature measurement with the radiation thermometer, the emissivity of a measurement target should be known. Meanwhile, the emissivity of the semiconductor wafer is known to differ largely in a manner that depends on a pattern or a film formed on its front surface. Unless the emissivity is established, temperature measurement with the radiation thermometer is impossible.

According to the suggestion of US 2012/0288970, after the temperature of a front surface and that of a back surface of a semiconductor wafer become equal to each other during irradiation with a flash, the emissivity of the front surface of the wafer is determined based on the temperature of the wafer measured with a radiation thermometer on a side closer to the back surface and light intensity measured on a side closer to the front surface. Then, by using the determined emissivity, the temperature of the front surface of the semiconductor wafer during the irradiation with a flash is determined.

However, according to the technique disclosed in US 2012/0288970, a sensor should be provided for each of the side closer to the front surface and the side closer to the back surface of the semiconductor wafer for measurement. This results in a complicated mechanism and a complicated algorithm for the determination.

Additionally, while a variety of materials have been used for semiconductor purposes in recent years, there has been a strong demand for measuring the temperature of a front surface of a substrate easily where emissivity is very difficult to measure such as a substrate including a silicon base and an epitaxial film of germanium formed on the base, for example.

SUMMARY OF THE INVENTION

The present invention is intended for a thermal processing method for heating a substrate by irradiating the substrate with a flash.

According to one aspect of this invention, the thermal processing method comprises the steps of: (a) preheating the substrate by increasing the substrate in temperature to a predetermined preheating temperature before irradiating the substrate with a flash; (b) heating the substrate increased in temperature to the preheating temperature by irradiating a front surface of the substrate with a flash; (c) measuring an increased temperature by which a back surface of the substrate is increased in temperature from the preheating temperature by irradiation with a flash; and (d) determining a front surface attained temperature of the substrate during irradiation with a flash based on the increased temperature.

The front surface attained temperature of the substrate can be determined only by measuring the temperature of the back surface of the substrate. Thus, the temperature of the front surface of the substrate can be measured with a simple structure irrespective of the condition of the front surface of the substrate.

Preferably, in the step (d), the front surface attained temperature is determined using an integral of the increased temperature.

Measurement accuracy can be increased.

The present invention is also intended for a thermal processing apparatus for heating a substrate by irradiating the substrate with a flash.

According to one aspect of this invention, the thermal processing apparatus comprises: a chamber that houses the substrate; a holding member to hold the substrate inside the chamber; a flash lamp that irradiates a front surface of the substrate held by the holding member with a flash; a preheating part that increases the substrate in temperature to a predetermined preheating temperature before the substrate is irradiated with a flash from the flash lamp; a back surface temperature measuring part that measures the temperature of a back surface of the substrate held by the holding member; and a front surface temperature determining part that determines a front surface attained temperature of the substrate during irradiation with a flash based on an increased temperature measured by the back surface temperature measuring part by which the back surface of the substrate is increased in temperature from the preheating temperature by irradiation with a flash.

The front surface attained temperature of the substrate can be determined only by measuring the temperature of the back surface of the substrate. Thus, the temperature of the front surface of the substrate can be measured with a simple structure irrespective of the condition of the front surface of the substrate.

Preferably, the front surface temperature determining part determines the front surface attained temperature using an integral of the increased temperature.

Measurement accuracy can be increased.

It is therefore an object of the present invention to measure the temperature of a front surface of a substrate with a simple structure irrespective of the condition of the front surface of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing an entire appearance of a holding member;

FIG. 3 is a plan view of the holding member as viewed from the upper surface thereof;

FIG. 6 is a side view of the transfer mechanism;

DESCRIPTION OF THE PREFERRED EMBODIMENTS

Figure 1:
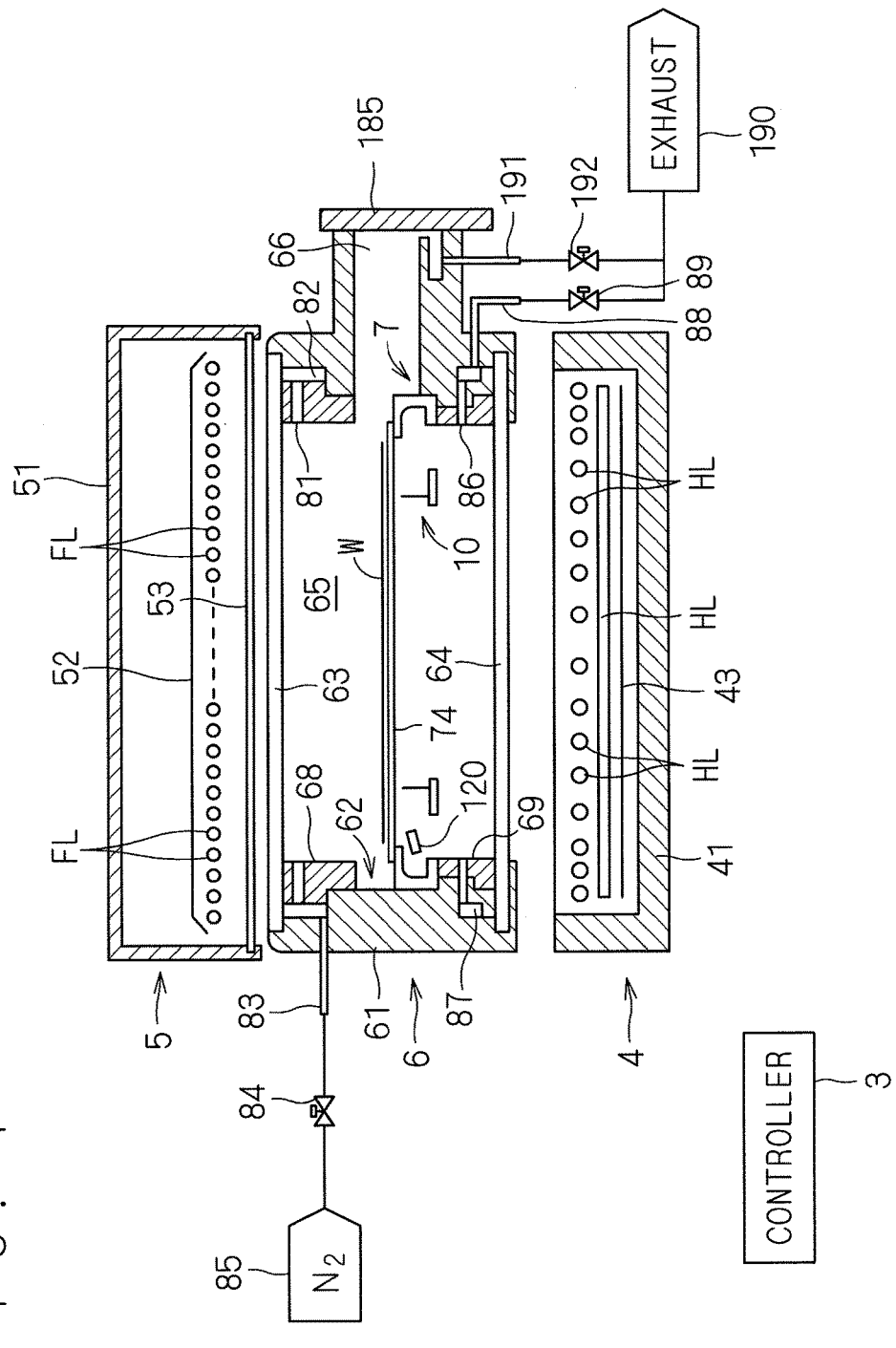
FIG. 1 is a vertical sectional view showing the structure of a thermal processing apparatus according to the present invention.

A preferred embodiment of the present invention is described in detail below by referring to the drawings.

FIG. 1 is a vertical sectional view showing the structure of a thermal processing apparatus 1 according to the present invention. The thermal processing apparatus 1 of this preferred embodiment is a flash lamp annealing apparatus that heats a semiconductor wafer W of a circular plate shape as a substrate by irradiating the semiconductor wafer W with a flash. Although not specifically limited, the size of a semiconductor wafer W to be processed is 300 mm or 450 mm in diameter, for example. A semiconductor wafer W before being transported into the thermal processing apparatus 1 contains implanted impurities. The implanted impurities are activated by thermal process in the thermal processing apparatus 1. In order to facilitate understanding, in FIG. 1 and its subsequent figures, the dimensions of components and the numbers of the components are exaggerated or simplified, where necessary.

The thermal processing apparatus 1 includes a chamber 6 that houses a semiconductor wafer W, a flash heating unit 5 with a plurality of built-in flash lamps FL, and a halogen heating unit 4 with a plurality of built-in halogen lamps HL. The flash heating unit 5 and the halogen heating unit 4 are arranged above and below the chamber 6 respectively. The thermal processing apparatus 1 further includes a holding member 7 and a transfer mechanism 10 provided inside the chamber 6. The holding member 7 holds a semiconductor wafer W in a horizontal posture. The transfer mechanism 10 transfers a semiconductor wafer W between the holding member 7 and a place outside the apparatus. The thermal processing apparatus 1 further includes a controller 3 that controls each operating mechanism of the halogen heating unit 4, the flash heating unit 5, and the chamber 6 to realize thermal process on a semiconductor wafer W.

The chamber 6 is formed of chamber windows made of quartz attached to an upper part and a lower part of a columnar chamber side section 61. The chamber side section 61 has a substantially columnar shape with an upper opening and a lower opening. An upper chamber window 63 is attached to the upper opening to close the upper opening. A lower chamber window 64 is attached to the lower opening to close the lower opening. The upper chamber window 63 forming a ceiling part of the chamber 6 is a circular plate member made of quartz. The upper chamber window 63 functions as a quarts window to cause flashes emitted from the flash heating unit 5 to reach the inside of the chamber 6. The lower chamber window 64 forming a floor part of the chamber 6 is also a circular plate member made of quarts. The lower chamber window 64 functions as a quarts window to cause light emitted from the halogen heating unit 4 to reach the inside of the chamber 6.

A reflection ring 68 and a reflection ring 69 are attached to an upper part and a lower part respectively of an inner wall surface of the chamber side section 61. The reflection rings 68 and 69 are both formed into an annular shape. The upper reflection ring 68 is attached by being fitted from above the chamber side section 61. The lower reflection ring 69 is attached by being fitted from below the chamber side section 61 and then fastened with a screw not shown in the drawings. Specifically, the reflection rings 68 and 69 are attached to the chamber side section 61 in a manner that allows the reflection rings 68 and 69 to be removed freely from the chamber side section 61. Space inside the chamber 6, specifically, space surrounded by the upper chamber window 63, the lower chamber window 64, the chamber side section 61, and the reflection rings 68 and 69 is defined as thermal processing space 65.

Attaching the reflection rings 68 and 69 to the chamber side section 61 forms a recessed part 62 in the inner wall surface of the chamber 6. The recessed part 62 is surrounded by a central area of the inner wall surface of the chamber side section 61 not covered by the reflection rings 68 and 69, a lower end surface of the reflection ring 68, and an upper end surface of the reflection ring 69. The recessed part 62 is formed into an annular pattern along the inner wall surface of the chamber 6 in the horizontal direction. The recessed part 62 surrounds the holding member 7 to hold a semiconductor wafer W.

The chamber side section 61 and the reflection rings 68 and 69 are made of a metallic material having excellent strength and resistance to heat (such as stainless steel). The inner circumferential surfaces of the reflection rings 68 and 69 are mirror surfaces plated with electrolytic nickel.

A transport opening section (furnace opening) 66 is provided in the chamber side section 61 through which a semiconductor wafer W is transported into and out of the chamber 6. The transport opening section 66 can be opened and closed by a gate valve 185. The transport opening section 66 is communicatively connected to the outer peripheral surface of the recessed part 62. Thus, while the gate valve 185 opens the transport opening section 66, a semiconductor wafer W can be transported into and out of the thermal processing space 65 through the transport opening section 66 and the recessed part 62. If the gate valve 185 closes the transport opening section 66, the thermal processing space 65 inside the chamber 6 becomes hermetically sealed space.

A gas supply hole 81 is formed in an upper part of the inner wall of the chamber 6 through which processing gas (in this preferred embodiment, nitrogen gas ($N_2$)) is supplied into the thermal processing space 65. The gas supply hole 81 is formed above the recessed part 62 and may be formed in the reflection ring 68. The gas supply hole 81 is communicatively connected to a gas supply pipe 83 through buffer space 82 formed into an annular shape inside the side wall of the chamber 6. The gas supply pipe 83 is connected to a nitrogen gas source 85. A valve 84 is interposed in a pathway of the gas supply pipe 83. Opening the valve 84 supplies nitrogen gas from the nitrogen gas source 85 into the buffer space 82. The nitrogen gas having flown into the buffer space 82 spreads through the buffer space 82 lower in fluid resistance than the gas supply hole 81 and is then supplied into the thermal processing space 65 through the gas supply hole 81. The processing gas is not limited to nitrogen gas but it may also be an inert gas such as argon (Ar) or helium (He), or may be a reactive gas such as oxygen ($O_2$), hydrogen ($H_2$), chlorine ($Cl_2$), hydrogen chloride (HCl), ozone ($O_3$), or ammonia ($NH_3$).

A gas exhaust hole 86 is formed in a lower part of the inner wall of the chamber 6 through which gas is exhausted from the thermal processing space 65. The gas exhaust hole 86 is formed below the recessed part 62 and may be formed in the reflection ring 69. The gas exhaust hole 86 is communicatively connected to a gas exhaust pipe 88 through buffer space 87 formed into an annular shape inside the side wall of the chamber 6. The gas exhaust pipe 88 is connected to an exhaust unit 190. A valve 89 is interposed in a pathway of the gas exhaust pipe 88. Opening the valve 89 exhausts gas from the thermal processing space 65 and discharges the gas into the gas exhaust pipe 88 through the gas exhaust hole 86 and the buffer space 87. The gas supply hole 81 and the gas exhaust hole 86 may each be formed in multiple places in the peripheral direction of the chamber 6, or they may be formed as slits. The nitrogen gas source 85 and the exhaust unit 190 may be mechanisms provided in the thermal processing apparatus 1, or may be utilities of a factory where the thermal processing apparatus 1 is placed.

A gas exhaust pipe 191 is connected to the tip of the transport opening section 66 through which gas is further exhausted from the thermal processing space 65. The gas exhaust pipe 191 is connected through a valve 192 to the exhaust unit 190. Opening the valve 192 exhausts gas from the inside of the chamber 6 through the transport opening section 66.

Figure 4:
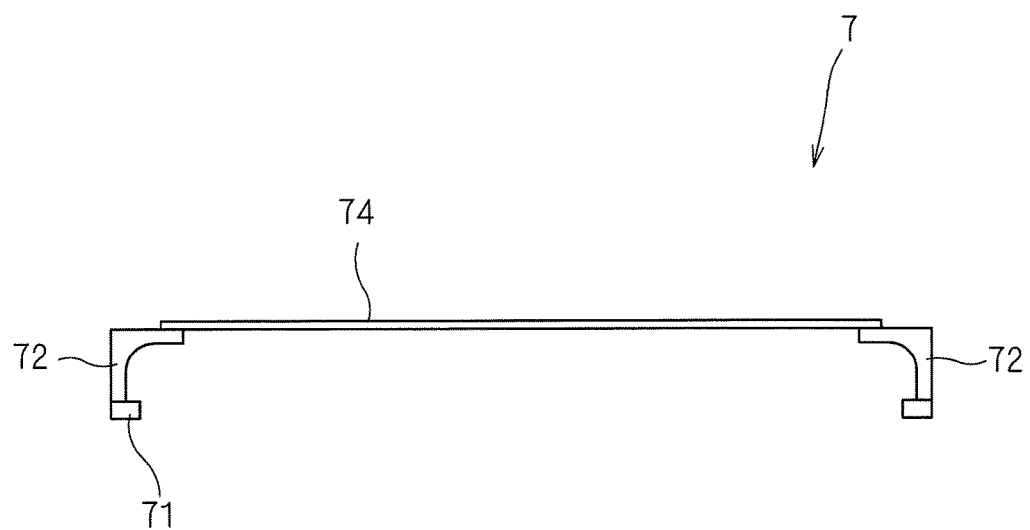
FIG. 4 is a side view of the holding member as viewed from a lateral side thereof.

FIG. 2 is a perspective view showing an entire appearance of the holding member 7. FIG. 3 is a plan view of the holding member 7 as viewed from the upper surface thereof. FIG. 4 is a side view of the holding member 7 as viewed from a lateral side thereof. The holding member 7 includes a base ring 71, coupling sections 72, and a susceptor 74. The base ring 71, the coupling sections 72, and the susceptor 74 are all made of quartz. Specifically, the entire holding member 7 is entirely made of quartz.

The base ring 71 is an annular quartz member. The base ring 71 is supported on the wall surface of the chamber 6 by being placed on the bottom surface of the recessed part 62 (see FIG. 1). Multiple coupling sections 72 (in this preferred embodiment, four coupling sections 72) are provided in upright positions on the upper surface of the annular base ring 71 to be arranged along the circumferential direction of the base ring 71. The coupling sections 72 are also quartz members and are fixedly attached by welding to the base ring 71. The base ring 71 may also be formed into a circular arc defined by forming a cut in part of an annular shape.

The susceptor 74 in the form of a flat plate is supported by the four coupling sections 72 on the base ring 71. The susceptor 74 is a flat plate member of a substantially circular shape made of quartz. The susceptor 74 is larger in diameter than a semiconductor wafer W. Specifically, the size of the susceptor 74 in a plane is larger than that of a semiconductor wafer W. Multiple guide pins 76 (in this preferred embodiment, five guide pins 76) are provided in upright positions on the upper surface of the susceptor 74. The five guide pins 76 are provided along the circumference of a circle concentric with the outer circumferential circle of the susceptor 74. The diameter of the circle along which the five guide pins 76 are arranged is slightly larger than the diameter of a semiconductor wafer W. All the guide pins 76 are also made of quartz. The guide pins 76 may be processed from an ingot of quartz to be integral with the susceptor 74. Alternatively, the guide pins 76 may be processed separately from the susceptor 74 and attached to the susceptor 74 by welding, for example.

The four coupling sections 72 provided in upright positions on the base ring 71 and the lower surface of a peripheral area of the susceptor 74 are fixedly attached by welding. Specifically, the susceptor 74 and the base ring 71 are fixedly coupled to each other via the coupling sections 72, so that the holding member 7 is an integrally formed quartz member. The base ring 71 of the holding member 7 is supported on the wall surface of the chamber 6, thereby attaching the holding member 7 to the chamber 6. While the holding member 7 is attached to the chamber 6, the susceptor 74 of a substantially circular plate shape is placed in a horizontal posture (a posture that makes the normal line thereof agree with the vertical direction). A semiconductor wafer W transported into the chamber 6 is placed and held in a horizontal posture on the susceptor 74 of the holding member 7 attached to the chamber 6. A semiconductor wafer W is placed inside the circle defined by the guide pins 76 to prevent displacement in position of the semiconductor wafer W in the horizontal direction. The number of the guide pins 76 is not limited to five, but it may be any number that can prevent displacement in position of a semiconductor wafer W.

As shown in FIGS. 2 and 3, an opening area 78 and a cut 77 are formed in the susceptor 74 to penetrate through the susceptor 74 vertically. The cut 77 is provided to let a probe tip of a thermocouple contact thermometer 130 pass therethrough. The opening area 78 is provided to make a radiation thermometer 120 receive light (infrared light) emitted from the lower surface of a semiconductor wafer W held on the susceptor 74. The radiation thermometer 120 and the contact thermometer 130 are both provided on a side closer to a back surface of a semiconductor wafer W held on the holding member 7. The radiation thermometer 120 is formed by using a pyrometer, for example. The radiation thermometer 120 receives light emitted from a back surface of a semiconductor wafer W held on the holding member 7 to measure the temperature of the back surface. Four through holes 79 are further formed in the susceptor 74. The through holes 79 penetrate through the susceptor 74 for transfer of a semiconductor wafer W with lift pins 12 of the transfer mechanism 10 described later.

Figure 5:
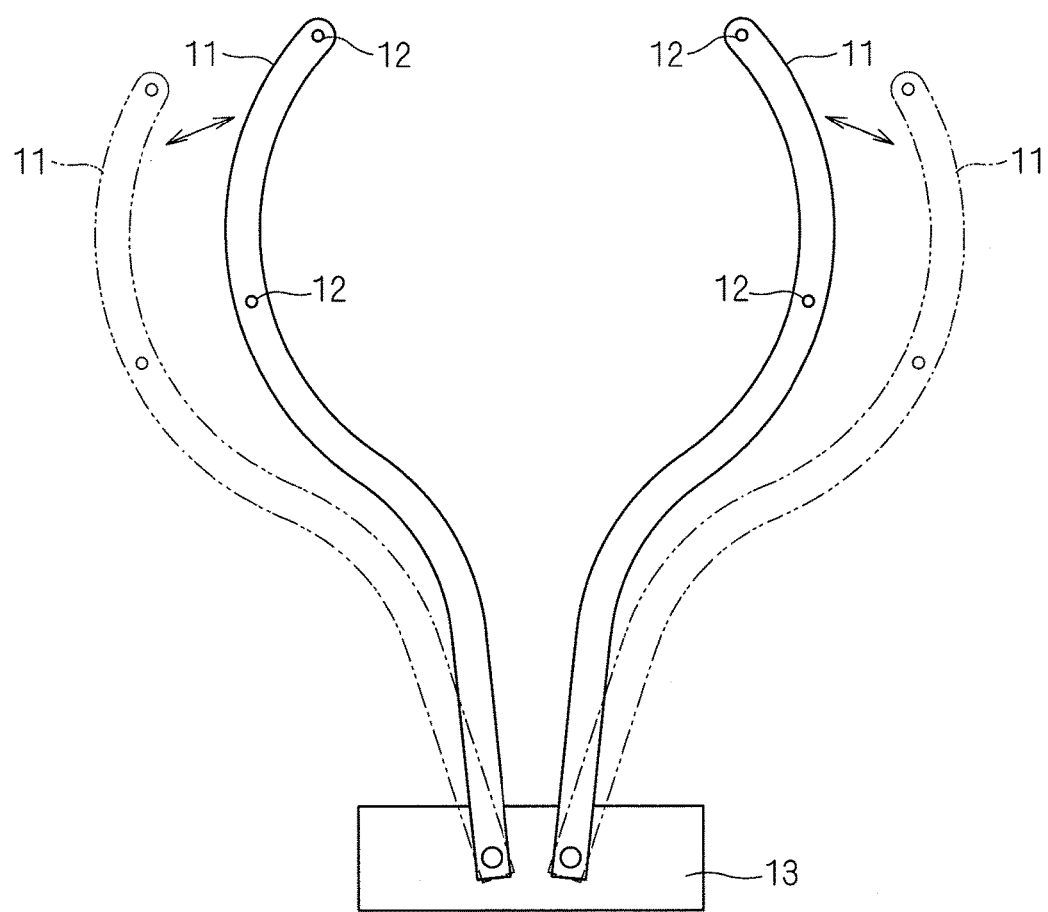
FIG. 5 is a plan view of a transfer mechanism.

FIG. 5 is a plan view of the transfer mechanism 10. FIG. 6 is a side view of the transfer mechanism 10. The transfer mechanism 10 includes two transfer arms 11. The transfer arms 11 are formed into a circular arc conforming to the substantially annular shape of the recessed part 62. Two lift pins 12 are provided in upright positions on each of the transfer arms 11. Each of the transfer arms 11 can be caused to pivot by a horizontal movement mechanism 13. The horizontal movement mechanism 13 moves the transfer arms 11 in a pair horizontally between a transfer operating position (a position with solid lines of FIG. 5) where a semiconductor wafer W is transferred to and received from the holding member 7, and a retracted position (a position with alternate long and two short dashed lines of FIG. 5) where the transfer arms 11 do not overlap a semiconductor wafer W in a plan view held on the holding member 7. The horizontal movement mechanism 13 may cause both the transfer arms 11 to pivot independently by using different motors, or may use a linking mechanism to cause the transfer arms 11 in a pair to pivot in an interlocked manner by using one motor.

The transfer arms 11 in a pair are moved up and down together with the horizontal movement mechanism 13 by an up-and-down mechanism 14. If the up-and-down mechanism 14 moves up the transfer arms 11 in a pair in the transfer operation position, the four lift pins 12 in total pass through the through holes 79 (see FIGS. 2 and 3) formed in the susceptor 74 to make the upper ends of the lift pins 12 project from the upper surface of the susceptor 74. If the up-and-down mechanism 14 moves down the transfer arms 11 in a pair in the transfer operating position, the lift pins 12 are extracted from the through holes 79. Then, the horizontal movement mechanism 13 moves the transfer arms 11 in a pair in such a manner that the transfer arms 11 are separated further from each other. In this way, each of the transfer arms 11 moves to the retracted position. The retracted position of the transfer arms 11 in a pair is directly above the base ring 71 of the holding member 7. The base ring 71 is placed on the bottom surface of the recessed part 62, so that the retracted position of the transfer arms 11 is defined inside the recessed part 62. An exhaust mechanism not shown in the drawings is further provided in a place near the driving part (horizontal movement mechanism 13 and up-and-down mechanism 14) of the transfer mechanism 10. This exhaust mechanism is configured to exhaust atmosphere around the driving part of the transfer mechanism 10 to the outside of the chamber 6.

Referring back to FIG. 1, the flash heating unit 5 arranged above the chamber 6 includes a light source formed of multiple xenon flash lamps FL (in this preferred embodiment, 30 xenon flash lamps FL), and a reflector 52 provided to cover the light source from above. The light source and the reflector 52 are housed in a casing 51. A lamp light radiation window 53 is attached to the bottom of the casing 51 of the flash heating unit 5. The lamp light radiation window 53 forming a floor part of the flash heating unit 5 is a plate-like quartz window. Placing the flash heating unit 5 above the chamber 6 makes the lamp light radiation window 53 face the upper chamber window 63. The flash lamps FL irradiate the thermal processing space 65 with flashes traveling from above the chamber 6 to reach the thermal processing space 65 through the lamp light radiation window 53 and the upper chamber window 63.

The flash lamps FL are each a bar-shaped lamp of an elongated cylindrical shape. The flash lamps FL are arranged in a plane in such a manner that the longitudinal directions thereof extend parallel to each other along a main surface of a semiconductor wafer W held on the holding member 7 (specifically, in the horizontal direction). Thus, a plane formed by the arrangement of the flash lamps FL is a horizontal plane.

The xenon flash lamps FL each include a bar-shaped glass tube (discharge tube) filled with xenon gas inside and having opposite ends where an anode and a cathode connected to a capacitor are arranged, and a trigger electrode provided on the outer peripheral surface of the glass tube. Xenon gas is an electrically insulating substance. Hence, even if electric charge is accumulated in the capacitor, electricity does not flow inside the glass tube in a normal condition. Meanwhile, if a high voltage is applied to the trigger electrode to cause insulation breakdown, electricity accumulated in the capacitor flows into the glass tube instantaneously to excite atoms or molecules of xenon, thereby emitting light. In these xenon flash lamps FL, electrostatic energy accumulated in advance in the capacitors is converted to an extremely short light pulse from 0.1 to 100 milliseconds. Thus, the xenon flash lamps FL are characteristically capable of emitting extremely intense light, compared to a light source such as the halogen lamps HL to be lighted continuously. Specifically, the flash lamps FL are pulse emitting lamps that emit light instantaneously in an extremely short period of time of less than one second. A period of time of light emission from the flash lamps FL can be controlled using a coil constant of a lamp power source to supply power to the flash lamps FL.

The reflector 52 is provided above the flash lamps FL to cover the flash lamps FL entirely. The basic function of the reflector 52 is to reflect flashes emitted from the flash lamps FL toward the thermal processing space 65. The reflector 52 is formed of an aluminum alloy plate and has a surface (a surface bordering the flash lamps FL) roughened as a result of blasting.

The halogen heating unit 4 arranged below the chamber 6 includes multiple built-in halogen lamps HL (in this preferred embodiment, 40 halogen lamps HL) housed in a casing 41 of the halogen heating unit 4. The halogen heating unit 4 is a light irradiator that uses the halogen lamps HL to irradiate the thermal processing space 65 with light traveling from below the chamber 6 to reach the thermal processing space 65 through the lower chamber window 64, thereby heating a semiconductor wafer W.

Figure 7:
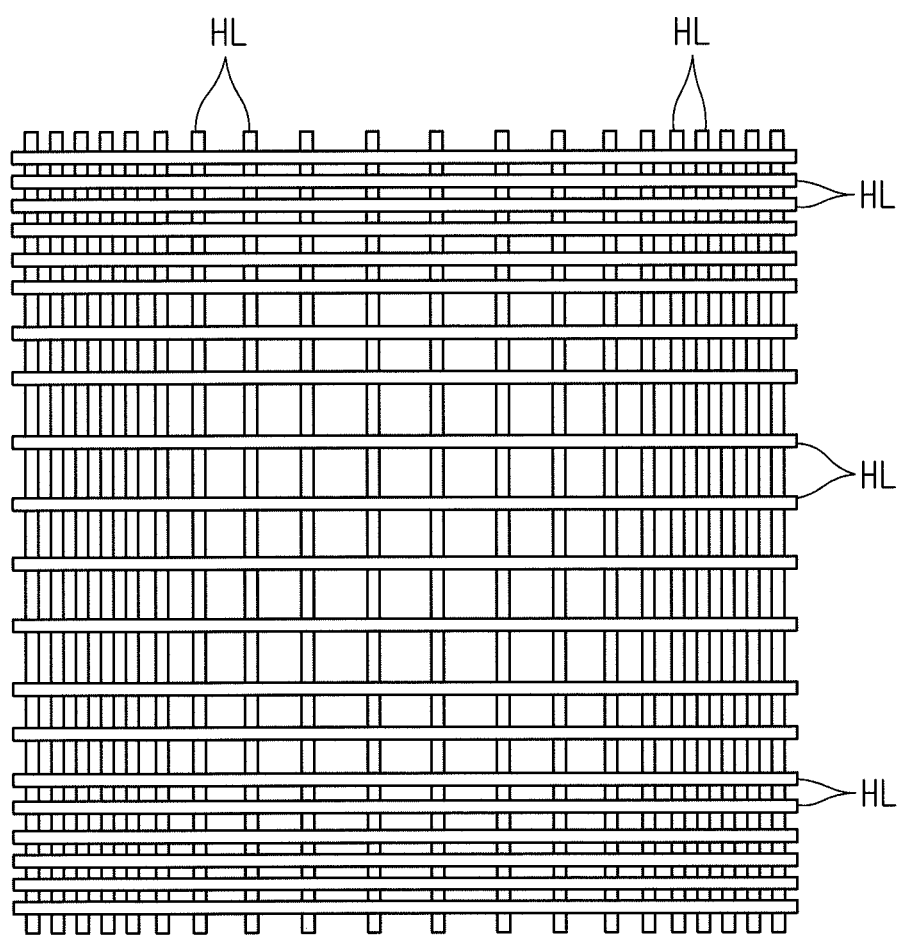
FIG. 7 is a plan view showing arrangement of a plurality of halogen lamps.

FIG. 7 is a plan view showing arrangement of the halogen lamps HL. The forty halogen lamps HL are arranged in two different tiers; an upper tier and a lower tier. Twenty halogen lamps HL are arranged in the upper tier closer to the holding member 7. Twenty halogen lamps HL are arranged in the lower tier farther from the holding member 7 than the upper tier. The halogen lamps HL are each a bar-shaped lamp of an elongated cylindrical shape. The 20 halogen lamps HL in each of the upper and lower tiers are arranged in such a manner that the longitudinal directions thereof extend parallel to each other along a main surface of a semiconductor wafer W held on the holding member 7 (specifically, in the horizontal direction). Thus, in each of the upper and lower tiers, a plane formed by the arrangement of the halogen lamps HL is a horizontal plane.

As shown in FIG. 7, in each of the upper and lower tiers, the halogen lamps HL are arranged more densely in a region facing a peripheral area of a semiconductor wafer W held on the holding member 7 than in a region facing a central area of the semiconductor wafer W. Specifically, in each of the upper and lower tiers, the pitch of the halogen lamps HL is shorter in a peripheral area of the lamp arrangement than in a central area thereof. This makes it possible to irradiate the peripheral area of the semiconductor wafer W with more light that is likely to cause temperature drop easily while being heated by irradiation with light from the halogen heating unit 4.

A lamp group formed of the halogen lamps HL in the upper tier and a lamp group formed of the halogen lamps HL in the lower tier are arranged to cross each other in a grid pattern. Specifically, a total of 40 halogen lamps HL are arranged in such a manner that the longitudinal direction of each halogen lamp HL in the upper tier and the longitudinal direction of each halogen lamp HL in the lower tier are orthogonal to each other.

The halogen lamps HL are each a filament type light source that energizes a filament in a glass tube to make the filament incandescent, thereby emitting light. The glass tube is filled with gas inside containing inert gas such as nitrogen or argon and a halogen element (iodine or bromine, for example) introduced in minute amount into the inert gas. Introducing the halogen element allows the temperature of the filament to be set high while suppressing breakage of the filament. Thus, the halogen lamps HL are characteristically long lasting and capable of emitting intense light continuously, compared to general incandescent bulbs. Specifically, the halogen lamps HL are continuously lighted lamps of emitting light continuously for at least one second or more. The halogen lamps HL are long-lasting lamps for their bar shapes, and irradiate a semiconductor wafer W above the halogen lamps HL with excellent efficiency as a result of the arrangement of the halogen lamps HL in the horizontal direction.

A reflector 43 is further provided in the casing 41 of the halogen heating unit 4 in a position below the halogen lamps HL in the two tiers (FIG. 1). The reflector 43 is to reflect light emitted from the halogen lamps HL toward the thermal processing space 65.

Figure 8:
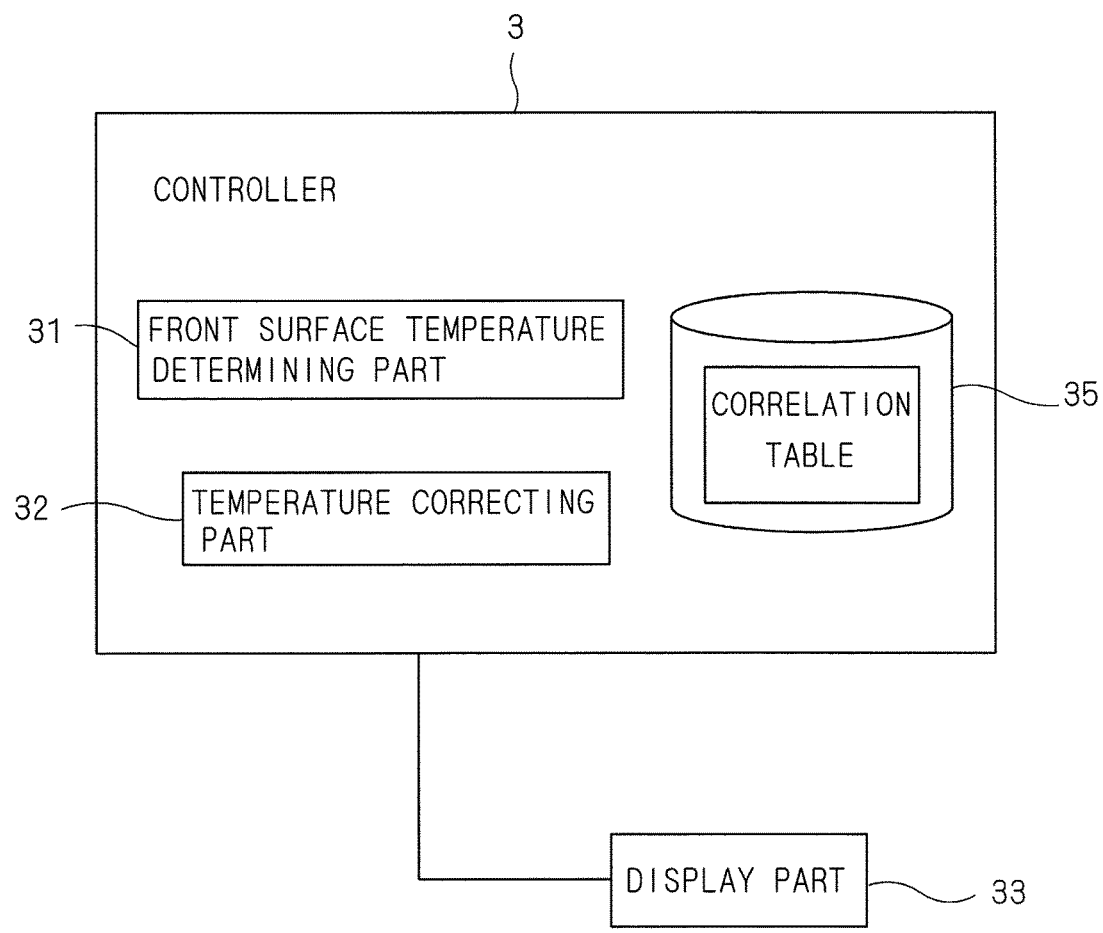
FIG. 8 is a block diagram showing the structure of a controller.

The controller 3 controls various operating mechanisms in the thermal processing apparatus 1. FIG. 8 is a block diagram showing the structure of the controller 3. The hardware structure of the controller 3 is the same as that of a generally used computer. Specifically, the controller 3 includes a CPU that is a circuit for performing various types of computations, a ROM that is a read-only memory storing a basic program, a RAM that is a freely readable and writable memory storing information of various types, and a magnetic disk 35 storing control software and data, etc. Execution of a certain processing program by the CPU of the controller 3 makes process go forward in the thermal processing apparatus 1.

As shown in FIG. 8, the controller 3 includes a front surface temperature determining part 31 and a temperature correcting part 32. The front surface temperature determining part 31 and the temperature correcting part 32 are functional processors realized by execution of the certain processing program by the CPU of the controller 3. The substances of processes by the front surface temperature determining part 31 and the temperature correcting part 32 are described later.

A display part 33 is connected to the controller 3. The display part 33 is, for example, a display panel such as a liquid crystal display provided on an outer wall of the thermal processing apparatus 1. A touch panel may be employed as the display part 33.

In addition to the aforementioned structures, the thermal processing apparatus 1 includes various cooling structures intended to prevent excessive temperature increase of the halogen heating unit 4, the flash heating unit 5, and the chamber 6 to be caused by heat energy generated from the halogen lamps HL and the flash lamps FL during thermal process on a semiconductor wafer W. For example, the wall of the chamber 6 is provided with a water-cooled tube (not shown in the drawings). The halogen heating unit 4 and the flash heating unit 5 are each configured as an air-cooled structure where heat is exhausted by a gas flow formed inside the structure. Further, air is supplied into a gap between the upper chamber window 63 and the lamp light radiation window 53 to cool the flash heating unit 5 and the upper chamber window 63.

A procedure of processing a semiconductor wafer W taken by the thermal processing apparatus 1 is described next. The semiconductor wafer W to be processed mentioned herein is a semiconductor substrate of silicon (Si) containing impurities (impurity ions) added by ion implantation process. The added impurities are activated through heating process by means of irradiation with a flash (annealing) performed in the thermal processing apparatus 1. The processing procedure descried below taken by the thermal processing apparatus 1 proceeds while the controller 3 controls each operating mechanism of the thermal processing apparatus 1.

First, the valve 84 for gas supply is opened and the valves 89 and 192 for gas exhaust are opened, thereby starting supply and exhaust of gas to and from the inside of the chamber 6. Opening the valve 84 supplies nitrogen gas from the gas supply hole 81 into the thermal processing space 65. Opening the valve 89 exhausts gas from the inside of the chamber 6 through the gas exhaust hole 86. In this way, the nitrogen gas supplied from an upper part of the thermal processing space 65 in the chamber 6 flows downwardly and is then exhausted from a lower part of the thermal processing space 65.

Opening the valve 192 also exhausts gas from the inside of the chamber 6 through the transport opening section 66. Further, the exhaust mechanism not shown in the drawings exhausts atmosphere around the driving part of the transfer mechanism 10. During thermal process on a semiconductor wafer W in the thermal processing apparatus 1, nitrogen gas is supplied continuously to the thermal processing space 65. The amount of the supply is changed appropriately in a manner that depends on a processing step.

Next, the gate valve 185 is opened to open the transport opening section 66. Then, a transport robot outside the apparatus transports a semiconductor wafer W containing implanted ions into the thermal processing space 65 in the chamber 6 through the transport opening section 66. The semiconductor wafer W transported into the thermal processing space 65 by the transport robot advances to a position directly above the holding member 7 and stops at this position. Then, the transfer arms 11 in a pair of the transfer mechanism 10 move horizontally from the retracted position to the transfer operating position and move up. As a result, the lift pins 12 pass through the through holes 79 to project from the upper surface of the susceptor 74. In this way, the semiconductor wafer W is received on the lift pins 12.

After the semiconductor wafer W is placed on the lift pins 12, the transport robot goes out of the thermal processing space 65 and the transport opening section 66 is closed using the gate valve 185. Then, the transfer arms 11 in a pair move down to transfer the semiconductor wafer W from the transfer mechanism 10 to the susceptor 74 of the holding member 7 and hold the semiconductor wafer W in a horizontal posture from below. The semiconductor wafer W is held by the holding member 7 while a front surface of the semiconductor wafer W provided with a pattern and containing implanted impurities is placed as an upper surface. The semiconductor wafer W is held inside the five guide pins 76 on the upper surface of the susceptor 74. The transfer arms 11 in a pair having moved down to a place below the susceptor 74 are retracted by the horizontal movement mechanism 13 to the retracted position, specifically, to a place inside the recessed part 62.

After the semiconductor wafer W is held from below in a horizontal posture by the holding member 7 made of quartz, the 40 halogen lamps HL of the halogen heating unit 4 are turned on in unison to start preheating (assisted heating). Halogen light emitted from the halogen lamps HL passes through the lower chamber window 64 and the susceptor 74 made of quarts to be emitted from a back surface of the semiconductor wafer W. The back surface of the semiconductor wafer W is a main surface opposite the front surface thereof. The back surface of the semiconductor wafer W is generally not provided with a pattern. By being irradiated with the light from the halogen lamps HL, the semiconductor wafer W is preheated to be increased in temperature. The transfer arms 11 of the transfer mechanism 10 are retracted to a place inside the recessed part 62, so that the transfer arms 11 do not become an obstacle to the preheating by the halogen lamps HL.

The temperature of the semiconductor wafer W during thermal process is measured with the radiation thermometer 120. Specifically, the light emitted from the back surface of the semiconductor wafer W and having passed through the opening area 78 of the susceptor 74 is received by the radiation thermometer 120 to measure a wafer temperature. The emissivity of a measurement target is necessary for temperature measurement using the radiation thermometer 120. Meanwhile, the back surface of the semiconductor wafer W is typically not provided with a pattern or a film formed or deposited thereon and silicon is exposed at the back surface of the semiconductor wafer W. Thus, the emissivity of the back surface of the semiconductor wafer W is known. The back surface of the semiconductor wafer W may be subjected to film deposition process according to processing purpose. In this case, a specific film is deposited uniformly. Thus, like in the aforementioned absence of a pattern or a film, the emissivity of this back surface of the semiconductor wafer W is known. As a result, by receiving the light emitted from the back surface of the semiconductor wafer W using the radiation thermometer 120, a temperature can be measured accurately with favorable reproducibility.

Figure 9:
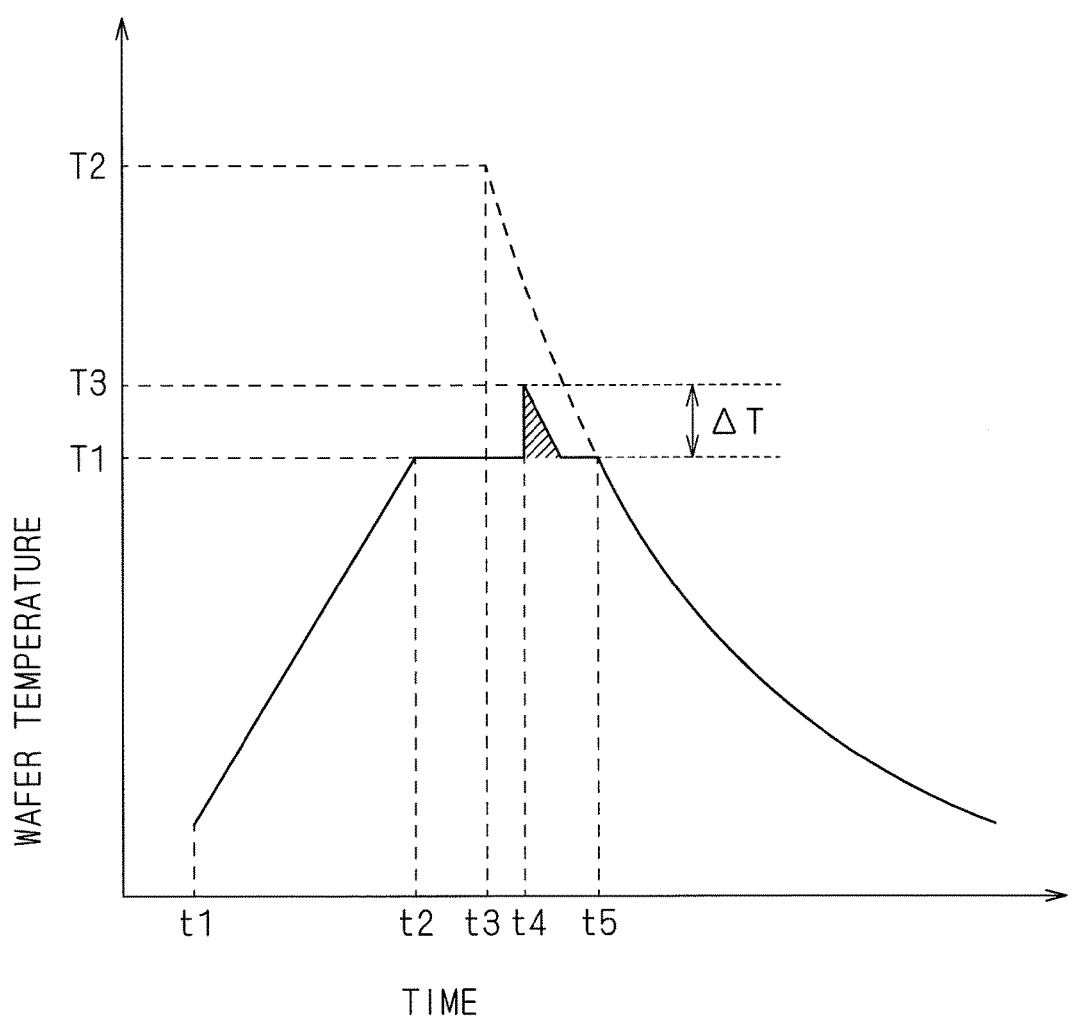
FIG. 9 schematically shows change in the temperature of a semiconductor wafer measured with a radiation thermometer.

FIG. 9 schematically shows change in the temperature of the semiconductor wafer W measured with the radiation thermometer 120. At time t1, the preheating by the halogen lamps HL is started to increase the temperature of the semiconductor wafer W. In a precise sense, a temperature measured with the radiation thermometer 120 is that of the back surface of the semiconductor wafer W. Meanwhile, at the preheating stage, a difference in temperature between the front surface and the back surface of the semiconductor wafer W is ignorable. Thus, the temperature measured at this stage with the radiation thermometer 120 can be regarded as the temperature of the entire semiconductor wafer W. The measured temperature of the semiconductor wafer W is transmitted to the controller 3. The controller 3 controls outputs from the halogen lamps HL, while checking the temperature of the semiconductor wafer W increased by the irradiation with light from the halogen laps HL to see whether this temperature has attained a preheating temperature T1. Specifically, based on a measured value obtained using the radiation thermometer 120, the controller 3 executes feedback control on outputs from the halogen lamps HL in such a manner that the temperature of the semiconductor wafer W becomes equal to the preheating temperature T1. The preheating temperature T1 is set at a temperature from about 200 to about 800° C., more preferably, from about 350 to about 600° C. (in this preferred embodiment, 600° C.) that can prevent diffusion by heat of the impurities added to the semiconductor wafer W. While the temperature of the semiconductor wafer W is relatively low, this temperature cannot be measurement easily with the radiation thermometer 120 in some cases. Thus, at the preheating stage, the contact thermometer 130 may additionally be used for the temperature measurement.

After the temperature of the semiconductor wafer W attains the preheating temperature T1 at time t2, the controller 3 maintains the semiconductor wafer W at the preheating temperature T1 for a while. More specifically, the controller 3 controls outputs from the halogen lamps HL at a time when the temperature of the semiconductor wafer W measured with the radiation thermometer 120 attains the preheating temperature T1 to substantially maintain the temperature of the semiconductor wafer W at the preheating temperature T1.

As a result of the aforementioned preheating by the halogen lamps HL, the semiconductor wafer W is entirely increased in temperature to the preheating temperature T1. At the stage of the preheating by the halogen lamps HL, the temperature of the semiconductor wafer W is more likely to drop in a peripheral area than in a central area as heat escapes more easily in the peripheral area than in the central area. Meanwhile, the halogen lamps HL in the halogen heating unit 4 are arranged more densely in a region facing the peripheral area of the semiconductor wafer W than in a region facing the central area of the semiconductor wafer W. Thus, the peripheral area of the semiconductor wafer W where heat escapes more easily is irradiated with more light, so that an in-plane temperature distribution of the semiconductor wafer W can be uniform at the preheating stage. Additionally, the inner circumferential surface of the reflection ring 69 attached to the chamber side section 61 is a mirror surface. This inner circumferential surface of the reflection ring 69 increases the amount of light to be reflected toward the peripheral area of the semiconductor wafer W, making it possible to achieve a more uniform in-plane temperature distribution of the semiconductor wafer W at the preheating stage.

At time t3 when a predetermined period of time has elapsed after the temperature of the semiconductor wafer W attains the preheating temperature T1, the front surface of the semiconductor wafer W is irradiated with flashes from the flash lamps FL. At this time, some of the flashes emitted from the flash lamps FL travel toward the inside of the chamber 6 directly, whereas the other flashes are reflected once by the reflector 52 and then travel toward the inside of the chamber 6. The semiconductor wafer W is flash heated by being irradiated with these flashes.

The flash heating is performed by irradiation with flashes (bursts of light) from the flash lamps FL, so that the temperature of the front surface of the semiconductor wafer W can be increased in a short period of time. Specifically, flashes emitted from the flash lamps FL are extremely short and intense bursts of light of extremely short light pulses to be applied in a period of time from 0.1 to 100 milliseconds that result from conversion from electrostatic energy accumulated in advance in the capacitors. The temperature of the front surface of the semiconductor wafer W flash heated by being irradiated with flashes from the flash lamps FL increases instantaneously as high as to a processing temperature T2 of 1000° C. or more to activate the impurities implanted in the semiconductor wafer W. Then, the temperature of the front surface drops rapidly. In this way, the temperature of the front surface of the semiconductor wafer W can be increased and reduced in an extremely short period of time. This allows activation of the impurities implanted in the semiconductor wafer W while suppressing diffusion of the impurities by heat. The semiconductor wafer W is preheated to the preheating temperature T1 by the halogen lamps HL before the semiconductor wafer W is irradiated with flashes from the flash lamps FL. Thus, the front surface of the semiconductor wafer W can be increased in temperature to the processing temperature T2 of 1000° C. or more by irradiation with flashes in an extremely short period of time. A period of time required for activation of the impurities is extremely shorter than a period of time required for diffusion of the impurities by heat. Thus, the activation is completed even in a short period of time from about 0.1 to about 100 milliseconds that does not cause diffusion of the impurities.

The temperature of the back surface of the semiconductor wafer W is also measured with the radiation thermometer 120 during the irradiation with flashes from the flash lamps FL. The irradiation with flashes applies a massive amount of energy to the front surface of the semiconductor wafer W in an extremely short period of time, so that the front surface of the semiconductor wafer W is increased in temperature rapidly before temperature increase of the back surface of the semiconductor wafer W during the irradiation with flashes. In FIG. 9, the temperature of the front surface of the semiconductor wafer W is indicated by dotted lines for reference. This temperature is not an actually measured temperature measured with the radiation thermometer 120. A temperature measured with the radiation temperature 120 is the temperature of the back surface of the semiconductor wafer W indicated by solid lines of FIG. 9.

As shown by the dotted lines of FIG. 9, the front surface of the semiconductor wafer W attains the processing temperature T2 of 1000° C. or more at the moment of the irradiation with flashes from the flash lamps FL at the time t3. Meanwhile, as shown by the solid lines of FIG. 9, the temperature of the back surface of the semiconductor wafer W exhibits substantially no increase from the preheating temperature T1 at the moment of the irradiation with flashes. The temperature of the back surface of the semiconductor wafer W is increased slightly at time t4 delayed by a short period from the time t3 when the temperature of the front surface of the semiconductor wafer W is increased by the irradiation with flashes. Specifically, there is a slight delay between the time when the temperature of the front surface of the semiconductor wafer W is increased rapidly and the time when the temperature of the back surface of the semiconductor wafer W is increased thereafter. This is for the reason that it takes time to transfer heat from the front surface of the semiconductor wafer W where a temperature has been increased instantaneously by the irradiation with flashes in an extremely short period of time to the back surface of the semiconductor wafer W. For example, if the thickness of the semiconductor wafer W is 0.775 mm, heat transfer from the front surface to the back surface takes about 20 milliseconds.

As shown in FIG. 9, a temperature T3 attained by the back surface of the semiconductor wafer W at the time t4 is considerably lower than the processing temperature T2 attained by the front surface of the semiconductor wafer W at the moment of the irradiation with flashes. Specifically, the temperature of the back surface of the semiconductor wafer W is not increased as high as the temperature of the front surface thereof. This means only the front surface and its vicinity of the semiconductor wafer W is increased selectively by the flash heating, which can be used appropriately for forming a shallow junction.

The temperature T3 attained by the back surface of the semiconductor wafer W at the time t4 is measured accurately with the radiation thermometer 120. The attained temperature T3 of the back surface measured with the radiation thermometer 120 is transmitted to the controller 3. Based on the attained temperature T3 of the back surface of the semiconductor wafer W measured with the radiation thermometer 120, the front surface temperature determining part 31 of the controller 3 (FIG. 8) determines the processing temperature T2 that is a temperature attained by the front surface.

More specifically, the front surface temperature determining part 31 first obtains an increased temperature $\Delta T$ by which the back surface of the semiconductor wafer W is increased in temperature from the preheating temperature T1 by the irradiation with flashes. Specifically, the front surface temperature determining part 31 calculates the increased temperature $\Delta T$ by subtracting the preheating temperature T1 from the attained temperature T3 of the back surface.

The amount of heat transferred from the front surface to the back surface of the semiconductor wafer W is defined according to the magnitude of energy applied to the front surface of the semiconductor wafer W by the irradiation with flashes from the flash lamps FL. The increased temperature $\Delta T$ of the back surface of the semiconductor wafer W is defined by the amount of heat transferred from the front surface to the back surface of the semiconductor wafer W. Specifically, the increased temperature $\Delta T$ of the back surface of the semiconductor wafer W during the irradiation with flashes is proportionate to the magnitude of energy applied to the front surface of the semiconductor wafer W by the irradiation with flashes. The specific heat of the silicon semiconductor wafer W is known (substantially the same as the specific heat of silicon). Thus, as long as the magnitude of energy applied to the front surface of the semiconductor wafer W can be obtained using the increased temperature $\Delta T$ of the back surface of the semiconductor wafer W, an increased temperature at the front surface of the semiconductor wafer W can be determined. By adding the determined increased temperature to the preheating temperature T1, the processing temperature T2 as an attained temperature of the front surface can be determined.

Based on the aforementioned principle, the processing temperature T2 of the front surface of the semiconductor wafer W can be determined using the increased temperature $\Delta T$ of the back surface of the semiconductor wafer W. In this preferred embodiment, to determine the processing temperature T2 more promptly, a correlation between the increased temperature ΔT and the processing temperature T2 as a front surface attained temperature is determined in advance. Based on this correlation, the processing temperature T2 is determined.

Figure 10:
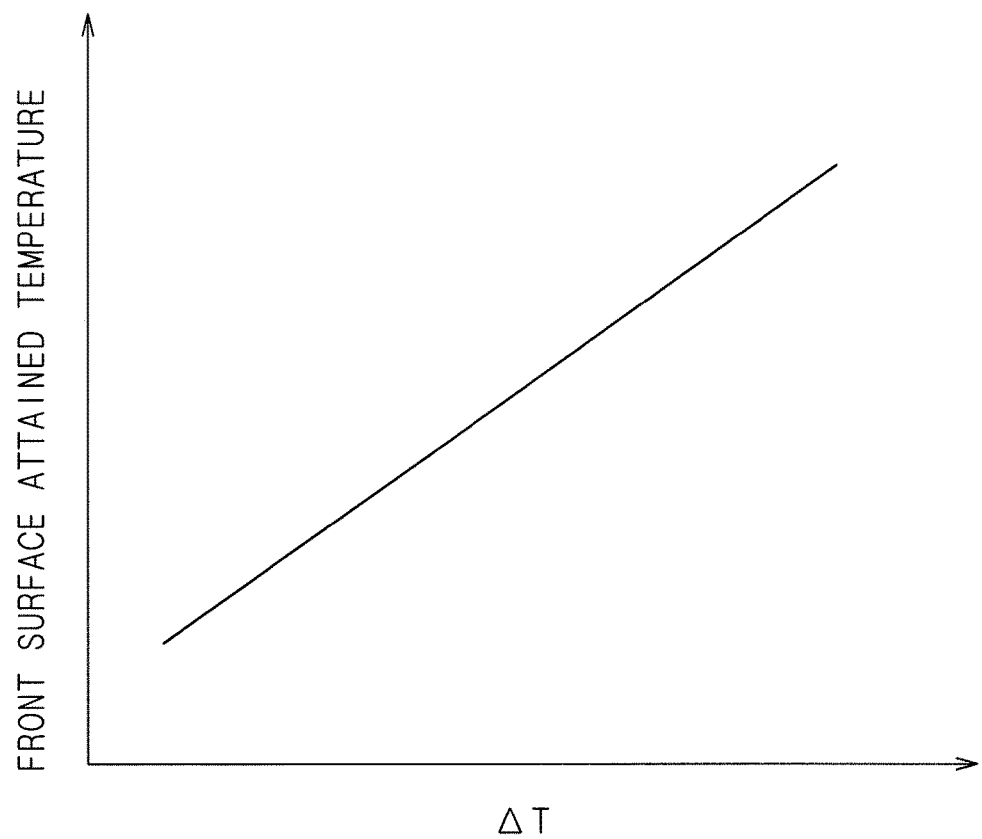
FIG. 10 shows a correlation between an increased temperature of a back surface of a semiconductor wafer and an attained temperature of a front surface of the semiconductor wafer during irradiation with a flash.

FIG. 10 shows a correlation between the increased temperature ΔT of the back surface and an attained temperature of the front surface of the semiconductor wafer W during the irradiation with flashes. As shown in FIG. 10, a linear relationship expressed by the following formula (1) is defined between the increased temperature ΔT of the back surface and the processing temperature T2 as a front surface attained temperature of the semiconductor wafer W during the irradiation with flashes:

$$T2=T1+a\Delta T \quad (1)$$

The correlation shown in FIG. 10 is determined in advance by experiment or simulation conducted using a dummy silicon wafer, for example. The correlation shown in FIG. 10 is stored as a correlation table into the magnetic disk 35 of the controller 3 (see FIG. 8). Instead of the correlation table, the formula (1) may be stored into the magnetic disk 35 of the controller 3.

Based on the correlation table shown in FIG. 10 or the correlation expressed by the formula (1) between the increased temperature ΔT of the back surface and a front surface attained temperature of the semiconductor wafer W, the front surface temperature determining part 31 of the controller 3 determines a front surface attained temperature of the semiconductor wafer W during the irradiation with flashes using the increased temperature ΔT. The controller 3 displays the determined front surface attained temperature of the semiconductor wafer W on the display part 33.

At time t5 when a predetermined period of time has elapsed after the flash heating process is finished, the halogen lamps HL are turned off. As a result, the temperature of the semiconductor wafer W drops rapidly from the preheating temperature T1. The dropping temperature of the semiconductor wafer W is measured with the contact thermometer 130 or the radiation thermometer 120 and a result of the measurement is transmitted to the controller 3. The controller 3 checks the temperature of the semiconductor wafer W using the measurement result to see whether this temperature has dropped to a predetermined temperature. After the temperature of the semiconductor wafer W has dropped to the predetermined temperature or less, the transfer arms 11 in a pair of the transfer mechanism 10 again move horizontally from the retracted position to the transfer operating position and move up. This makes the lift pins 12 project from the upper surface of the susceptor 74 to receive the thermally processed semiconductor wafer W from the susceptor 74. Next, the transport opening section 66 closed by the gate valve 185 is opened and the semiconductor wafer W placed on the lift pins 12 is transported out of the apparatus by the transport robot outside the apparatus. In this way, the heating process on the semiconductor wafer W in the thermal processing apparatus 1 is completed.

In this preferred embodiment, from the stage of preheating by the halogen lamps HL to the irradiation with flashes by the flash lamps FL, the radiation thermometer 120 is used for measuring the temperature of a back surface of a semiconductor wafer W to determine the increased temperature ΔT by which the back surface of the semiconductor wafer W is increased in temperature from the preheating temperature T1 by irradiation with flashes. Based on the correlation between the increased temperature ΔT and a front surface attained temperature, the front surface temperature determining part 31 of the controller 3 determines the front surface attained temperature of the semiconductor wafer W during the irradiation with flashes using the increased temperature ΔT. Specifically, only the temperature of the back surface of the semiconductor wafer W is measured with the radiation thermometer 120 and the front surface attained temperature of the semiconductor wafer W is determined based on a result of this measurement.

A front surface of a semiconductor wafer W is provided with a pattern. Thus, the emissivity of the front surface is not known and is not uniform in the entire front surface. By contrast, a back surface of the semiconductor wafer W is not provided with a pattern or a film deposited thereon to expose silicon. In other cases, a specific film is deposited uniformly on the back surface. Thus, the emissivity of the back surface is known. Hence, even with the noncontact radiation thermometer 120, the temperature of the back surface of the semiconductor wafer W can still be measured accurately with favorable reproducibility. The increased temperature ΔT, by which the back surface of the semiconductor wafer W is increased in temperature from the preheating temperature T1 by irradiation with flashes, is proportionate to the magnitude of energy applied to the front surface of the semiconductor wafer W by the irradiation with flashes and does not depend on the detail of a pattern formed on the front surface of the semiconductor wafer W (specifically, does not depend on the emissivity of the front surface). Thus, by measuring the temperature of the back surface of the semiconductor wafer W with the radiation temperature 120 and obtaining the increased temperature ΔT from the preheating temperature T1 accurately, the processing temperature T2 as a front surface attained temperature of the semiconductor wafer W during the irradiation with flashes can be determined.

A front surface attained temperature of a semiconductor wafer W can be determined only by providing the radiation thermometer 120 for receiving emitted light from a back surface of the semiconductor wafer W and measuring a temperature without requiring provision of a sensor for measuring the intensity of emitted light from a front surface of the semiconductor wafer W. Specifically, according to the present invention, the temperature of the front surface of the semiconductor wafer W can be measured with a simple structure irrespective of the condition of the front surface of the semiconductor wafer W.

In addition to the preferred embodiment of the present invention described above, the present invention can be changed in various ways without departing from the scope of the invention. For example, in the aforementioned preferred embodiment, a semiconductor wafer W to be processed is made only of silicon (while impurities of a tiny quantity are added to the wafer W, effect on the specific heat of the semiconductor wafer W caused by this quantity is ignorable). However, such a semiconductor wafer W is not the only processing target. Even a semiconductor substrate having a stack of layers made of different materials can still be subjected to temperature measurement using the technique of the present invention. For example, by employing the same method as that of the aforementioned preferred embodiment, the temperature of a back surface of a semiconductor substrate containing germanium (Ge) epitaxially grown on a silicon base can be measured with the radiation thermometer 120 to obtain the increased temperature ΔT during irradiation with flashes. Then, a front surface attained temperature of this substrate can be determined using the increased temperature ΔT. In the substrate including the germanium epitaxial film formed on a front surface, the emissivity of the back surface of this substrate is known as silicon is exposed at the back surface. Thus, even in this substrate, the temperature of the back surface can still be measured accurately with the radiation thermometer 120.

In the case of a substrate including a silicon base and a film formed on the silicon base and made of a material different from silicon, the specific heat of a front surface and its vicinity of the substrate differs from that of a substrate made only of silicon. To measure the temperature of such a substrate including a stacked layer made of a material different from silicon, the temperature correcting part 32 of the controller 3 (FIG. 8) corrects a front surface attained temperature (a temperature determined based on the specific heat of silicon) determined by the front surface temperature determining part 31. The temperature correcting part 32 makes this correction based on the specific heats of the materials forming the substrate. In the case of the aforementioned substrate including the silicon base and the germanium epitaxial film formed on the silicon base, for example, the temperature correcting part 32 reduces a front surface attained temperature determined by the front surface temperature determining part 31 by about three percent based on a difference in specific heat between silicon and germanium. In this way, a front surface attained temperature of this substrate can be determined.

The emissivity of a front surface is very difficult to measure in a substrate having a stack structure such as a substrate including a silicon base and a germanium epitaxial film formed on the silicon base. However, by employing the aforementioned technique, an attained temperature of the front surface of the substrate can be measured easily. Specifically, the technique according to the present invention is used appropriately particularly for measuring a front surface attained temperature of a substrate having such a stack structure and where the emissivity of a front surface is difficult to measure.

In the aforementioned preferred embodiment, a front surface attained temperature of a semiconductor wafer W during irradiation with flashes is determined using the increased temperature $\Delta T$ of a back surface of the semiconductor wafer W. Alternatively, a front surface attained temperature of a semiconductor wafer W may be determined using an integral of the increased temperature $\Delta T$. More specifically, the front surface temperature determining part 31 determines a front surface attained temperature of a semiconductor wafer W using an integral obtained by integrating the increased temperature $\Delta T$ with respect to time by which a back surface of the semiconductor wafer W is increased in temperature from the preheating temperature T1 during irradiation with flashes (specifically, this integral is shown as a dashed region of FIG. 9).

As a result of irradiation with flashes in an extremely short period of time, a period of time when the temperature of a back surface of a semiconductor wafer W increases from the preheating temperature T1 is also extremely short. Meanwhile, time of sampling with the radiation thermometer 120 can be reduced only to limited time. This may make it impossible to measure the temperature T3 attained by the back surface of the semiconductor wafer W with the radiation thermometer 120 to coincide with the time t4 of FIG. 9. This causes the risk of an error in the increased temperature $\Delta T$ of the back surface of the semiconductor wafer W during irradiation with flashes. By determining a front surface attained temperature of the semiconductor wafer W using an integral of the increased temperature $\Delta T$, a measurement error of the increased temperature $\Delta T$ to be caused by sampling time with the radiation thermometer 120 is reduced. This can enhance accuracy in determining a front surface attained temperature of the semiconductor wafer W.

In the aforementioned preferred embodiment, 30 flash lamps FL are provided in the flash heating unit 5. However, the number of the flash lamps FL is not limited to 30 but it can be determined arbitrarily. Further, the flash lamps FL are not limited to xenon flash lamps but they may also be krypton flash lamps. Additionally, the number of the halogen lamps HL in the halogen heating unit 4 is not limited to 40 but it can be determined arbitrarily.

In the aforementioned preferred embodiment, a semiconductor wafer W is preheated by being irradiated with halogen light from the halogen lamps HL. However, this is not the only method of the preheating. The semiconductor wafer W may be preheated by being placed on a hot plate.

While the invention has been described in detail, the foregoing description is in all aspects illustrative and not restrictive. It is therefore understood that numerous modifications and variations can be devised without departing from the scope of the invention.

What is claimed is:

1. A thermal processing method for heating a substrate by irradiating said substrate with a flash, comprising the steps of:
   (a) preheating said substrate by increasing said substrate in temperature to a predetermined preheating temperature before irradiating said substrate with a flash;
   (b) heating said substrate increased in temperature to said preheating temperature by irradiating a front surface of said substrate with a flash;
   (c) measuring an increased temperature by which a back surface of said substrate is increased in temperature from said preheating temperature by irradiation with a flash; and
   (d) determining a front surface attained temperature of said substrate during irradiation with a flash based on said increased temperature,
   wherein said step (d) includes the step of:
   (d-1) correcting said determined front surface attained temperature using the specific heat of said substrate.

2. The thermal processing method according to claim 1, wherein in said step (d), said front surface attained temperature is determined using an integral of said increased temperature.

3. The thermal processing method according to claim 1, further comprising the step of obtaining a correlation between said increased temperature and said front surface attained temperature,
   wherein in said step (d), said front surface attained temperature is determined based on said correlation.

4. The thermal processing method according to claim 1, further comprising the step of:
   (e) displaying said determined front surface attained temperature.

5. A thermal processing apparatus for heating a substrate by irradiating said substrate with a flash, comprising:
   a chamber that houses said substrate;
   a holding member to hold said substrate inside said chamber;
   a flash lamp that irradiates a front surface of said substrate held by said holding member with a flash;
   a preheating part that increases said substrate in temperature to a predetermined preheating temperature before said substrate is irradiated with a flash from said flash lamp;

a back surface temperature measuring part that measures the temperature of a back surface of said substrate held by said holding member;

a front surface temperature determining part that determines a front surface attained temperature of said substrate during irradiation with a flash based on an increased temperature measured by said back surface temperature measuring part by which said back surface of said substrate is increased in temperature from said preheating temperature by irradiation with a flash; and a temperature correcting part that corrects said front surface attained temperature determined by said front surface temperature determining part, said front surface attained temperature being corrected using the specific heat of said substrate.

6. The thermal processing apparatus according to claim 5, wherein the front surface temperature determining part determines said front surface attained temperature using an integral of said increased temperature.

7. The thermal processing apparatus according to claim 5, further comprising a storage that stores a correlation between said increased temperature and said front surface attained temperature, wherein the front surface temperature determining part determines said front surface attained temperature based on said correlation.

8. The thermal processing apparatus according to claim 5, further comprising a display part on which said front surface attained temperature is displayed.

* * * * *